(12) United States Patent
Overweg

(10) Patent No.: US 11,255,935 B2
(45) Date of Patent: Feb. 22, 2022

(54) GRADIENT SHIELD COIL WITH MEANDERING WINDING FOR A MAGNETIC RESONANCE IMAGING APPARATUS

(71) Applicant: KONINKLIJKE PHILIPS N.V., Eindhoven (NL)

(72) Inventor: Johannes Adrianus Overweg, Uelzen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 17/051,206

(22) PCT Filed: Apr. 26, 2019

(86) PCT No.: PCT/EP2019/060715
§ 371 (c)(1),
(2) Date: Oct. 28, 2020

(87) PCT Pub. No.: WO2019/211183
PCT Pub. Date: Nov. 7, 2019

(65) Prior Publication Data
US 2021/0132168 A1    May 6, 2021

(30) Foreign Application Priority Data

Apr. 30, 2018  (EP) .................................... 18170033

(51) Int. Cl.
*G01R 33/385*       (2006.01)
*G01R 33/3815*      (2006.01)
*G01R 33/421*       (2006.01)

(52) U.S. Cl.
CPC ....... *G01R 33/385* (2013.01); *G01R 33/3815* (2013.01); *G01R 33/4215* (2013.01)

(58) Field of Classification Search
CPC .............. G01R 33/385; G01R 33/3815; G01R 33/4215
See application file for complete search history.

(56) References Cited

U.S. PATENT DOCUMENTS 4,794,338 A * 12/1988 Roemer ............. G01R 33/4215
                                              324/318
5,592,087 A    1/1997 Richard et al.
(Continued)

FOREIGN PATENT DOCUMENTS

JP        2013022052 A    2/2013

OTHER PUBLICATIONS

Search Report and Written Opinion from PCT/EP2019/060715 dated Jul. 10, 2019.

*Primary Examiner* — G. M. A Hyder

(57) ABSTRACT

The invention relates to a gradient shield coil (5) for a MRI apparatus (1). The gradient shield coil (5) according to the invention comprises windings (6, 7) around its longitudinal axis (A), wherein at least one winding (7) is arranged as a meandering winding (7). This meandering winding (7) comprises multiple contiguous sections (8) along its circumference, wherein in each of these sections (8) a pair of conductor loops (9, 10) is provided in such a way that a current in the meandering winding (7) would run in opposite directions in the two conductor loops (9, 10). In this way, dissipation in the superconductive coils of a superconductive magnet (2) of a respective MRI apparatus (1) may be further reduced.

13 Claims, 2 Drawing Sheets

(56) References Cited

U.S. PATENT DOCUMENTS

| | | |
|---|---|---|
| 2010/0194393 A1 | 8/2010 | Abe et al. |
| 2010/0244836 A1 | 9/2010 | Hollis |
| 2012/0176137 A1* | 7/2012 | Terada ................. G01R 33/385 |
| | | 324/322 |
| 2016/0139221 A1 | 5/2016 | Overweg |

* cited by examiner

GRADIENT SHIELD COIL WITH MEANDERING WINDING FOR A MAGNETIC RESONANCE IMAGING APPARATUS

CROSS REFERENCE TO RELATED APPLICATIONS

This application is a U.S. national phase application of International Application No. PCT/EP2019/060715 filed on Apr. 26, 2019, which claims the benefit of EP Application Ser. No. 18170033.7 filed on Apr. 30, 2018 and is incorporated herein by reference.

FIELD OF THE INVENTION

The invention relates to the field of MRI imaging and in particular to gradient shield coils for a MRI apparatus.

BACKGROUND OF THE INVENTION

A magnetic field is used in magnetic resonance imaging (MRI) to align the nuclear spins of atoms as part of the procedure for yielding images within the body of a patient. This magnetic field is referred to as the main magnetic field or BO field. During a MRI scan, radio frequency (RF) pulses which are generated by a transmitter or amplifier and an antenna cause perturbations to the local magnetic field and can be used to manipulate the orientation of the nuclear spins relative to the BO field. Spatial encoding of the magnetic spins may be accomplished by using so called gradient coils, which are used to superimpose a magnetic field gradient upon the BO magnetic field. RF signals emitted by the nuclear spins are detected by a receiver coil, and these RF signals are used to generate the MRI images.

The magnets used to generate the BO field typically use superconductive coils. The magnetic field generated by the gradient coils can cause eddy currents and, hence, dissipation within the superconductive coils and within electrically conducting structures inside the superconducting magnet. These eddy currents can be reduced by using gradient coils with active shielding. US 2016/0139221 A1 discloses such an active shielding in the form of gradient shield coils which surround the gradient coils of a MRI apparatus.

According to US 2016/0139221 A1 a magnetic gradient coil for a magnetic resonance imaging system is provided. The magnetic gradient coil is actively shielded, wherein the magnetic gradient coil is operable for generating a magnetic field. The magnetic field has a cylindrical axis of symmetry and the gradient coil has a length parallel with the cylindrical axis of symmetry. The magnetic gradient coil has an outer surface. The magnetic field comprises an external magnetic field outside of the outer surface. This external magnetic field has at least four reduced field regions along the length where the modulus of the magnetic field is less than the average of the modulus of the magnetic field along the length.

Further, from US 2010/0194393 A1 a gradient coil device is known which can suppress the generation of an error magnetic field and, thus, an eddy current, and which may improve the image quality of a cross-sectional image. A respective MRI device includes a first coil generating a linear magnetic field distribution at an imaging region of the MRI device, and a second coil which suppresses leakage of a magnetic field from the first coil to a static-magnetic-field coil device that generates a uniform magnetic field distribution at the imaging region.

The US patent application is designed to achieve proper shielding function for a shielded gradient coil in which the gap between the field coil and the shield coil changes with the circumferential direction. This shield gradient coil has a wiring pattern with two circumferential serpentines, at radially opposite locations near the narrow regions of the gap between the field coil and the shield coil.

SUMMARY OF THE INVENTION

It is an object of the invention to further reduce dissipation in the superconductive coils and other electrically conducting structures of the magnet of a MRI system.

According to the invention, this object is addressed by the subject matter of the independent claims. Preferred embodiments of the invention are described in the sub claims.

Therefore, according to the invention, a gradient shield coil for a MRI apparatus is provided, the gradient shield coil comprising windings around its longitudinal axis, wherein at least one winding is arranged as a meandering winding by comprising multiple contiguous sections along its circumference, wherein in each of these sections a pair of conductor loops is provided in such a way that a current in the meandering winding would run in opposite directions in the two conductor loops.

According to the invention, large circulating currents in cylindrical magnet parts are transformed into a multitude of local eddy-currents, which cause less dissipation and less mechanical excitation of these parts. The optimum current distribution for the active shield layer of a z-gradient coil usually has low current density at the ends and near the mid plane of the coil. Approximating this ideal current distribution by a set of discrete turns with empty spaces in between leads to external field imperfections that cause significant circulating current in structures like the radiation screen or an inner bore liner of the magnet. These currents lead to dissipation and mechanical excitation of these components. By transforming these circular windings into at least one meandering winding, as described before, the induced currents in the magnet can be transformed into a pattern of very local circulating currents. These eddy-currents decay faster, dissipate less and cause less mechanical excitation. Thus, according to the invention, the dissipation in the magnet can be reduced by at least a factor of 2.

The two conductor loops may, in general, be closed or almost closed loops. However, when it is referred to these conductor loops and to the feature that the current runs in opposite directions in these conductor loops this also comprises any case in which these conductor loops are only formed by parts of the meandering winding which partially run in different, preferably opposite, directions, preferably at the same length of the circumference of the meandering winding, i.e. in the same section of the meandering winding.

In general, the conductor loops can be arranged in different ways within the sections. However, according to a preferred embodiment of the invention, in each section the two conductor loops are arranged adjacent to each other at the same length along the circumference of the winding.

The positive effect of the invention may already achieved by providing a single pair of conductor loops in each section. Alternatively, according to a preferred embodiment of the invention, in each section multiple pairs of loops are provided in such a way that a current in the meandering winding would run in opposite directions in the two conductor loops of a respective pair. In that situation it is preferred that in each section the conductor loops are arranged adjacent to each other at the same length along the circumference of the winding.

Different arrangements of the sections along the circumference of the meandering winding may be used in order to achieve the positive effects of the invention. However, according to a preferred embodiment of the invention, the sections with the pairs of conductor loops are arranged with a regular spacing from each other along the circumference of the meandering winding.

Further, it is preferred that the gradient coil has a cylindrical shape with two open ends, and that the at least one meandering winding is arranged at one of these open ends. It is further preferred that at least one meandering winding is arranged at both of these open ends, respectively. It is further preferred that at least one meandering winding is arranged near the midplane of the coil. Preferably, the winding density is smaller at the area of the open ends and in the area of the midplane. Further, according to a preferred embodiment of the invention, at least two meandering windings are arranged in its middle region.

Preferably, at least one curved winding is provided adjacent to a meandering winding, wherein the curved winding does not run straight but does not comprise any conductor loops as the meandering windings, either. Preferably, adjacent to each meandering winding a curved winding which is arranged.

According to a preferred embodiment of the invention, the meandering winding is manufactured from a copper plate using a method such as punching or water jet cutting. Alternatively, according to a preferred embodiment of the invention, meandering winding is wound from a hollow conductor.

The invention also relates to a MRI apparatus comprising a superconductive magnet for generating a main magnetic field of the MRI apparatus and at least one gradient coil for generating a gradient magnetic field superimposing the main magnetic field, wherein the gradient coil is surrounded by the superconductive magnet and wherein the superconductive magnet is shielded from the gradient magnetic field by a gradient field coil as described above which is arranged between the superconductive magnet and the gradient coil.

According to a preferred embodiment of the MRI apparatus, the gradient coil comprises saddle windings near the mid plane of the gradient coil and the at least one meandering winding is arranged over the saddle windings near the mid plane of the gradient coil in a region of lower winding density than in the other regions, in such a way that the superconducting magnet is shielded from these saddle windings.

The invention also relates to a method of shielding a superconductive magnet from the gradient magnetic field generated by a gradient coil of a MRI apparatus by arranging a gradient shield coil between the superconductive magnet and the gradient coil, the gradient shield coil comprising windings around its longitudinal axis, wherein at least one winding is arranged as a meandering winding by comprising multiple contiguous sections along its circumference, wherein in each of these sections a pair of conductor loops is provided in which a current in the meandering winding runs in opposite directions in the two conductor loops.

Preferred embodiments of the MRI apparatus and the method of shielding a superconductive magnet from the gradient magnetic field generated by a gradient coil of a MRI apparatus also result from the preferred embodiments of the gradient shield coils as described further above.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
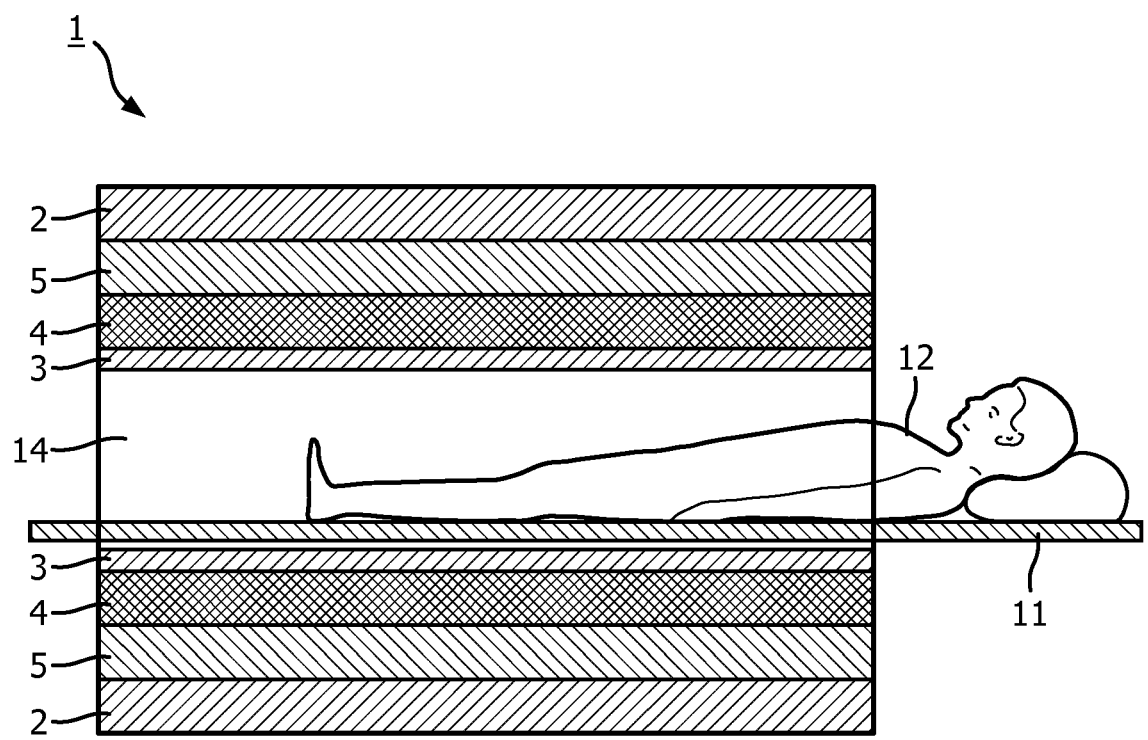
FIG. 1 schematically depicts a MRI apparatus according to a preferred embodiment of the invention in a cross sectional view, FIG. 2 schematically depicts a gradient shield coil according to a preferred embodiment of the invention in a side view, and FIG. 3 schematically depicts an enlarged view of a part of the meandering winding 7 from FIG. 2

FIG. 1 schematically depicts a MRI apparatus 1 according to a preferred embodiment of the invention in a cross sectional view. This MRI apparatus 1 comprises a superconductive magnet 2 for generating the main magnetic field (BO field) of the MRI apparatus 1. This superconductive magnet 2 comprises superconductive coils since for MRI imaging typically a magnetic field of several Tesla is required. For imaging, this magnetic field is used to align the nuclear spins of atoms within an object of examination, typically a patient 12 lying on a patient table 11 within the bore 14 of the MRI apparatus 1. During a MRI scan, a RF coil 3 is used for generating radio frequency (RF) pulses for causing perturbations to the local magnetic field. In this way the orientation of the nuclear spins relative to the BO field may be manipulated. For spatial encoding of the magnetic spins, gradient coils 4 are provided, i.e. x-, y- and z-gradient coils 4, which superimpose a magnetic field gradient upon the BO magnetic field generated by the superconductive magnet 2.

The external magnetic field generated by the gradient coils 4 may cause eddy currents and, hence, dissipation within the superconductive coils of the superconductive magnet 2. These eddy currents may be reduced by using gradient shield coils 5, i.e. x-, y- and z-gradient shield coils 5, which surround the gradient coils 4 and, thus, shield the superconductive coils of the superconductive magnet 2 from the gradient fields generated by the gradient coils 4. Both, the gradient coils 4 and the gradient shield coils 5 may be cooled, for example by flowing water through hollow conductors (not shown).

Figure 2:
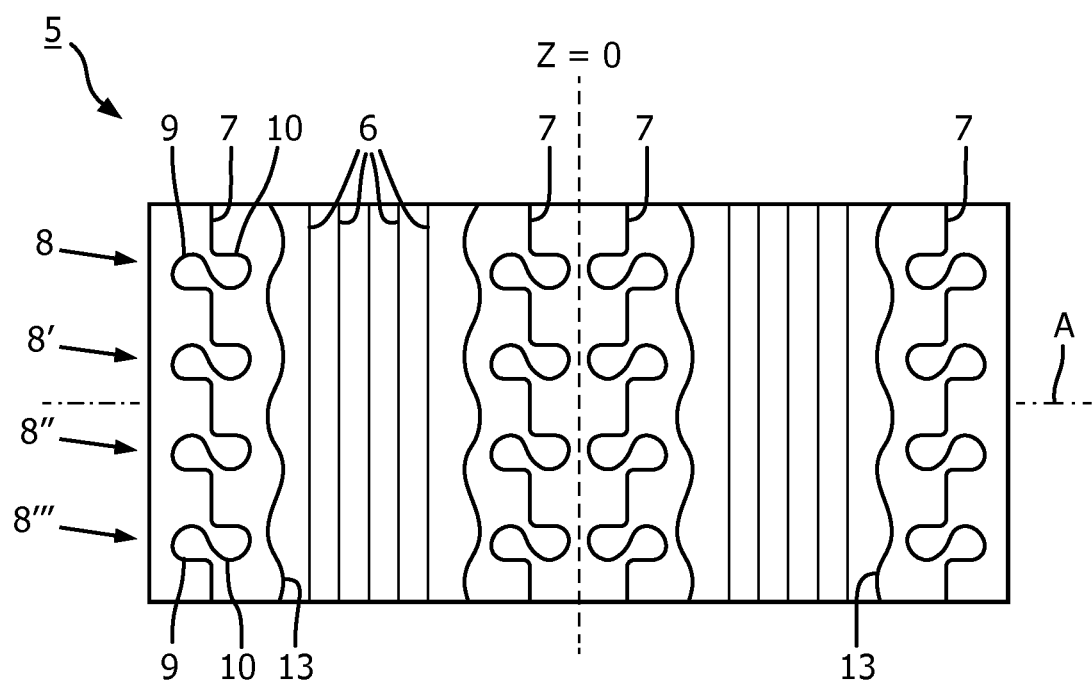

FIG. 2 schematically depicts a z-gradient shield coil 5 according to the preferred embodiment of the invention in more detail in a side view. As can be seen from FIG. 2, the gradient shield coil 5 has a cylindrical shape with two open ends and comprises straight windings 6, curved windings 7 and meandering windings 13 around its longitudinal axis A. The z-gradient coil 5 has antisymmetry relative to the z=0-plane in the middle.

At the left and right end of the z-gradient shield coil 5 as well as in the middle of the z-gradient shield coil in the region around z=0 the winding density is less. In these regions meandering windings 7 are arranged. Adjacent to the meandering windings 7 curved windings 13 are provided which do not run straight as the straight windings 6 but comprises a wave form design. Between the curved windings 13 regular, straight running windings 6 are arranged. The spacing of the straight windings 6 from each other is less than the spacing of the curved windings 13 and the meandering windings 7 from neighboring windings in the regions at the end and in the middle of the z-gradient shield coil 5. It is to be noted that FIG. 2 is a schematical view in which only a reduced number of windings 6, 7, 13 are shown for clarity reasons and easy understanding.

The meandering windings 7 comprise multiple contiguous sections 8, 8', 8", 8''' along their circumference, wherein in each of these sections 8, 8', 8", 8''' a pair of conductor loops 9, 10 is provided in such a way that a current in the meandering winding 7 runs in opposite directions in the two conductor loops 9, 10. This shown in more detail in FIG. 3 which is a schematic enlarged view of a part of a meandering winding 7 from FIG. 2 wherein the direction of the electric current is indicated by consecutive arrows. While the direction of the electric current in the loop 9 on the left side is counterclockwise, the direction of the electric current in the loop 10 on the right side is clockwise.

In this way, large circulating currents in cylindrical parts of the superconductive magnet 2 are transformed into a plurality of local eddy-currents, causing less dissipation and less mechanical excitation in the magnet 2. By providing meandering windings 7 at both ends of the gradient shielding coil 5 and in the region near the midplane (z=0) of the coil, the induced currents in the superconductive magnet 2 are transformed into a pattern of currents which are only circulating locally. These local eddy-currents decay faster, dissipate less and cause less mechanical excitation in the superconductive magnet 2. In this way, dissipation in the superconductive magnet 2 may be reduced by at least a factor of 2.

According to the present preferred embodiment of the invention, the meandering windings 7 and the curved windings 13 are manufactured from a copper plate which has been manufactured by punching or water jet cutting. Alternatively, according to another preferred embodiment of the invention, the meandering windings 7 and the curved windings 13 may be wound from a hollow conductor.

Figure 3:
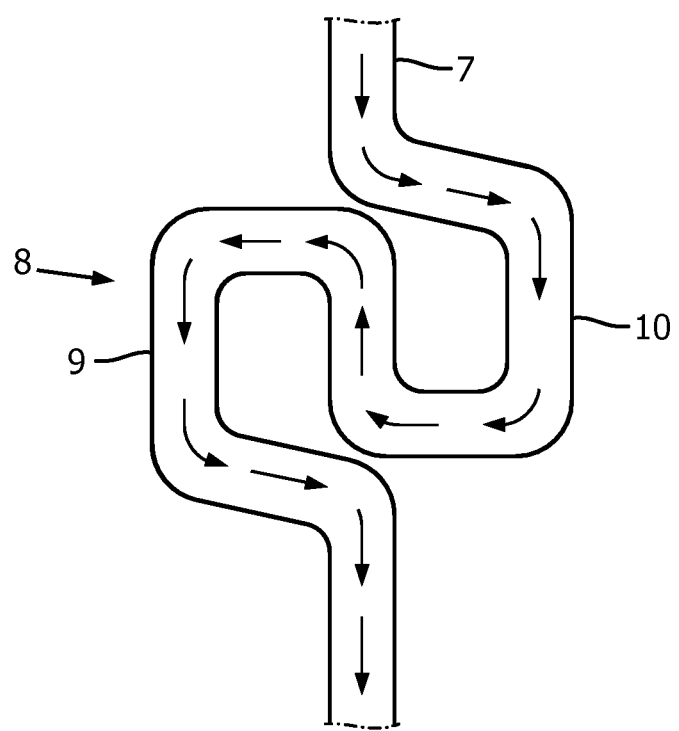

As may be gathered from FIGS. 2 and 3, in each section 8 the two conductor loops 9, 10 are arranged adjacent to each other at the same length along the circumference of the meandering winding 7. Though according to the preferred embodiment shown in FIGS. 2 and 3 only one single pair of conductor loops 9, 10 is shown it should be emphasized that the invention also allows for providing multiple pairs of conductor loops 9, 10 in each section 8 in such a way that a current in the meandering windings 7 runs in opposite directions in the two conductor loops 9, 10 of a respective pair.

Further, it may be seen from FIG. 2 that in each section the conductor loops 9, 10 are arranged adjacent to each other at the same length along the circumference of the meandering winding 7, wherein the sections 8 with the pairs of conductor loops 9, 10 are arranged with a regular spacing from each other along the circumference of the meandering winding 7.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST

MRI apparatus 1
magnet 2
RF coil 3
gradient coils 4
gradient shield coils 5
regular windings 6
meandering windings 7
sections 8
conductor loop 9
conductor loop 10
patient table 11
patient 12
curved windings 13
bore 14
longitudinal axis of gradient shield coil A

The invention claimed is:

1. A gradien shield coil for a MRI apparatus, the gradient shield coil comprising windings around its longitudinal axis (A), wherein at least one winding is arranged as a meandering winding by comprising multiple contiguous sections along its circumference, wherein in each of these sections a pair of conductor loops is provided in such a way that a current in the meandering winding would run in opposite directions in the two conductor loops.

2. The gradient shield coil according to claim 1, wherein in each section (8) the two conductor loops are arranged adjacent to each other at the same length along the circumference of the meandering winding.

3. The gradient shield coil according to claim 1, wherein in each section multiple pairs of conductor loops are provided in such a way that a current in the meandering winding would run in opposite directions in the two conductor loops of a respective pair.

4. The gradient shield coil according to claim 3, wherein in each section (8) the conductor loops are arranged adjacent to each other at the same length along the circumference of the meandering winding.

5. The gradient shield coil according to claim 1, wherein the sections with the pairs of conductor loops are arranged with a regular spacing from each other along the circumference of the meandering winding.

6. The gradient shield coil according to claim 1, wherein the gradient shield coil has a cylindrical shape with two open ends, and the at least one meandering winding is arranged at one of these open ends.

7. The gradient shield coil according to claim 6, wherein at least one meandering winding is arranged at both of these open ends, respectively.

8. The gradient shield coil according to claim 6, wherein at least two meandering windings are arranged in its middle region.

9. The gradient shield coil according to claim 1, wherein at least one curved winding is provided adjacent to a meandering winding, wherein the curved winding does not run straight in the gradient shield coil's cylindrical surface but does not comprise any conductor loops as the meandering windings, either.

10. The gradient shield coil according to claim 9, wherein a said curved winding is arranged adjacent to each meandering winding.

11. A magnetic resonance imaging (MRI) apparatus comprising a superconductive magnet for generating a main magnetic field of the MRI apparatus and at least one gradient coil for generating a gradient magnetic field superimposing the main magnetic field, wherein the gradient coil is surrounded by the superconductive magnet and wherein the superconductive magnet is shielded from the gradient magnetic field by a gradient shield coil according to claim 1 which is arranged between the superconductive magnet and the gradient coil.

12. The MRI apparatus according to claim 11, wherein the gradient coil comprises saddle windings near the mid plane of the gradient coil and the at least one meandering winding is arranged over the saddle windings near the mid plane of the gradient coil in such a way that the superconducting magnet is shielded from these saddle windings.

13. A method of shielding a superconductive magnet from the gradient magnetic field generated by a gradient coil of a MRI apparatus by arranging a gradient shield coil the superconductive magnet and the gradient coil, the gradient shield coil comprising windings around its longitudinal axis, wherein at least one winding is arranged as a meandering winding by comprising multiple contiguous sections along its circumference, wherein in each of these sections a pair of conductor loops is provided in such a way that a current in the meandering winding runs in opposite directions in the two conductor loops.

* * * * *